US009354653B2

(12) United States Patent
Takahashi

(10) Patent No.: US 9,354,653 B2
(45) Date of Patent: May 31, 2016

(54) POWER SUPPLY CIRCUITS

(75) Inventor: Kiyohiko Takahashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 440 days.

(21) Appl. No.: 14/112,668

(22) PCT Filed: Apr. 11, 2012

(86) PCT No.: PCT/JP2012/059935
§ 371 (c)(1),
(2), (4) Date: Oct. 18, 2013

(87) PCT Pub. No.: WO2012/144392
PCT Pub. Date: Oct. 26, 2012

(65) Prior Publication Data
US 2014/0028279 A1    Jan. 30, 2014

(30) Foreign Application Priority Data
Apr. 21, 2011    (JP) .................... 2011-095312

(51) Int. Cl.
*G05F 3/04* (2006.01)
*H03F 1/42* (2006.01)
(Continued)

(52) U.S. Cl.
CPC .............. *G05F 3/04* (2013.01); *H03F 1/0222* (2013.01); *H03F 1/42* (2013.01); *H03F 3/189* (2013.01);
(Continued)

(58) Field of Classification Search
CPC ....... H03F 1/025; H03F 1/307; H03F 1/0244; H03F 1/0211; H03F 3/217; H03F 3/2173; H03F 3/3066; H03F 2200/102; H03G 3/3042; H03G 3/004

USPC .......... 330/127, 199, 265, 267, 297; 323/271, 323/282, 351
See application file for complete search history.

(56) References Cited

U.S. PATENT DOCUMENTS 6,084,468 A    7/2000  Sigmon et al.
6,603,356 B1 *  8/2003  Kim .................... H03F 1/308
                                         330/2

(Continued)

FOREIGN PATENT DOCUMENTS

JP    10-56340 A    2/1998
JP    2001-519612 A    10/2001
(Continued)

OTHER PUBLICATIONS

Donald H. Kimball et al., "High-Efficiency Envelope-Tracking W-CDMA Base-Station Amplifier Using GaN HFETs", IEEE Transactions on Microwave Theory and Techniques 2006, pp. 1-9.

(Continued)

*Primary Examiner* — Adolf Berhane
(74) *Attorney, Agent, or Firm* — Sughrue Mion, PLLC

(57) ABSTRACT

A power supply circuit includes a first power amplifier that amplifies an input signal; a high pass filter that removes frequency components that are lower than a predetermined first cutoff frequency from an output signal of the first power amplifier; a current detector that detects a current value of the output signal of the first power amplifier; a composite signal generation circuit that combines the input signal and an output signal of the current detector; a second power amplifier that amplifies an output signal of the composite signal generation circuit; a low pass filter that removes frequency components that are higher than a predetermined second cutoff frequency from an output signal of the second power amplifier; and a signal output terminal that combines a current of an output signal of the high pass filter and a current of an output signal of the low pass filter and then outputs the resultant signal.

18 Claims, 7 Drawing Sheets

(51) Int. Cl.
*H03F 1/02* (2006.01)
*H03F 3/189* (2006.01)
*H03F 3/24* (2006.01)

(52) U.S. Cl.
CPC ............ *H03F 3/245* (2013.01); *H03F 2200/36* (2013.01); *H03F 2200/504* (2013.01); *H03F 2200/555* (2013.01)

(56) References Cited

U.S. PATENT DOCUMENTS

| | | | |
|---|---|---|---|
| 2004/0198275 A1* | 10/2004 | Loke | H04B 1/406 455/130 |
| 2004/0266372 A1* | 12/2004 | McCallister | H04B 1/0475 455/127.2 |
| 2010/0171553 A1* | 7/2010 | Okubo | H03F 1/0227 330/127 |
| 2014/0247757 A1* | 9/2014 | Rimini | H04B 1/525 370/278 |
| 2014/0334193 A1* | 11/2014 | Meyer | H02M 3/33584 363/21.01 |
| 2015/0249888 A1* | 9/2015 | Bogdanov | H03F 3/181 381/98 |

FOREIGN PATENT DOCUMENTS

| | | |
|---|---|---|
| JP | 2010-17008 A | 1/2010 |
| JP | 2011-30069 A | 2/2011 |
| WO | 2011/013420 A1 | 2/2011 |

OTHER PUBLICATIONS

Tae-Woo Kwak et al., "A 2 W CMOS Hybrid Switching Amplitude Modulator for EDGD Polar Transmitters", IEEE Journal of Solid State Circuits, Dec. 2007, pp. 2666-2676, vol. 42, No. 12.

International Search Report for PCT/JP2012/059935 dated May 29, 2012.

* cited by examiner

POWER SUPPLY CIRCUITS

CROSS REFERENCE TO RELATED APPLICATIONS

This application is a National Stage of International Application No. PCT/JP2012/059935 filed Apr. 11, 2012, claiming priority based on Japanese Patent Application No. 2011-095312 filed Apr. 21, 2011, the contents of all of which are incorporated herein by reference in their entirety.

TECHNICAL FIELD

The present invention relates to power supply circuits.

BACKGROUND ART

Recent radio communication systems have employed modulation schemes such as OFDM (Orthogonal Frequency-division Multiplexing) that enables realization of a frequency that is used with high efficiency. In radio communication systems using such modulation schemes, since a radio signal contains an amplitude modulation component and a phase modulation component, the PAPR (Peak to Average Power Ratio) levels of the radio signals become large. If a radio frequency modulation signal that contains an amplitude modulation component is amplified by ordinary class A amplifier or class B class amplifier, the signal needs to have sufficient backoff so as to ensure linearity. Generally, the backoff has to be at least the same as the PAPR level.

In contrast, the efficiencies of class A amplifiers and class B amplifiers become maximum when they operate in the saturation state. Their efficiencies are reversely proportional to the backoffs. The higher PAPR level a radio frequency modulation signal has, the more difficult it is for a power amplifier to improve power efficiency.

Polar modulation power amplifiers that efficiently amplify radio frequency modulation signals having high PAPR levels are known. Polar modulation power amplifiers are used to amplify radio frequency modulation signals that contain the foregoing amplitude component and phase components as polar coordinate components.

FIG. 1 is a circuit diagram showing the structure of a polar modulation power amplifier described as a related art reference in Non-Patent Literature 1.

The power amplifier shown in FIG. 1 includes radio frequency modulation signal input terminal 1101, amplitude signal input terminal 1102, power supply circuit 1103, radio frequency power amplifier 1104, and radio frequency modulation signal output terminal 1105. Power supply circuit 1103 includes linear amplifier 1106, subtraction unit 1107, current detection resistor 1108, hysteresis comparator 1109, switching amplifier 1110, inductor 1111, and power supply terminal 1112.

Input to radio frequency modulation signal input terminal 1101 is a radio frequency modulation signal that has been modulated with respect to amplitude and phase.

Input to amplitude signal input terminal 1102 is an amplitude signal that is an amplitude component of the radio frequency modulation signal that is input to radio frequency modulation signal input terminal 1101. The amplitude signal that is input to amplitude signal input terminal 1102 is amplified by power supply circuit 1103 and then supplied as a power source to radio frequency power amplifier 1104 through power supply terminal 1112. Radio frequency power amplifier 1104 amplifies the radio frequency modulation signal that is input to radio frequency modulation signal input terminal 1101 and then output from radio frequency modulation signal output terminal 1105.

Power supply circuit 1103 shown in FIG. 1 has switching amplifier 1110 and linear amplifier 1106 so as to amplify an input signal in high efficiency and with low distortion. The amplitude signal that is input to amplitude signal input terminal 1102 is linearly amplified by linear amplifier 1106 and then the resultant signal is output. Linear amplifier 1106 is a linear amplifier having low output impedance. The signal amplified by linear amplifier 1106 is output from power supply terminal 1112 through current detection resistor 1108.

Subtraction unit 1107 is connected to both ends of current detection resistor 1108 and then outputs a signal that represents the difference between the output voltage of linear amplifier 1106 and the voltage of power supply terminal 1112. Since subtraction unit 1107 has a high input impedance, it does not consume a large amount of power output from linear amplifier 1106. Current detection resistor 1108 is a resistor having low impedance. The voltage that occurs between both the ends of current detection resistor 1108 is the lowest voltage that can be accepted compared with the voltage of power supply terminal 1112.

The output signal of subtraction unit 1107 is input to hysteresis comparator 1109. Hysteresis comparator 1109 determines whether the polarity of the input signal is positive or negative and then outputs the determined result (pulse signal) to switching amplifier 1110. Hysteresis comparator 1109 has a function that stores an immediately preceding output state and a hysteresis characteristic (hysteresis width V_hys). Thus, if the signal level of the immediately preceding output signal is Low, when the voltage of the input signal becomes equal to or greater than V_hys/2, the signal level of the output signal of hysteresis comparator 1109 is inverted to High. In contrast, if the signal level of the immediately preceding output signal of hysteresis comparator 1109 is High, when the voltage of the input signal becomes equal to or lower than −V_hys/2, the signal level of the output signal of hysteresis comparator 1109 is inverted to Low.

Switching amplifier 1110 amplifies the signal that is input from hysteresis comparator 1109 and then supplies the resultant signal to power supply terminal 1112 through inductor 1111. At this point, a current that is output from switching amplifier 1110 through inductor 1111 is combined with a current that is output from linear amplifier 1106 through current detection resistor 1108 and then the resultant current is output from power supply terminal 1112.

Power supply circuit 1103 shown in FIG. 1 is an amplifier having the advantages of both linearity that is realized by linear amplifier 1106 and high efficiency that is realized by switching amplifier 1110. This is because the output voltage of power supply circuit 1103 depends on the output voltage of linear amplifier 1106 that has a low output impedance and most of the output current is output from switching amplifier 1110 having high efficiency. The current that is output from power supply terminal 1112 is the sum of the output current of linear amplifier 1106 and the output current of switching amplifier 1110. The voltage of power supply terminal 1112 depends on linear amplifier 1106 having a low output impedance. Linear amplifier 1106 outputs a current to power supply terminal 1112 such that the voltage of power supply terminal 1112 is kept at a target value. The output current of linear amplifier 1106 is detected by current detection resistor 1108 and subtraction unit 1107. Hysteresis comparator 1109 adjusts the current that is output from switching amplifier 1110 such that the output current of linear amplifier 1106 does not become excessive. In such a structure, since most of the current that is output from power supply terminal 1112 is supplied from switching amplifier 1110, linear amplifier 1106 needs to correct only the error component of switching amplifier 1110.

FIG. 2 is a circuit diagram showing the structure of a power supply circuit described as a related art reference in Non-Patent Literature 2.

The power supply circuit shown in FIG. 2 includes signal input terminal 1201, linear amplifier 1202, current detector 1203, amplifiers 1204, 1205, and 1207, adder 1206, PWM (Pulse Width Modulation) modulator 1208, switching amplifier 1209, inductor 1210, and signal output terminal 1211.

Input to signal input terminal 1201 is an amplitude signal that is an amplitude component of a radio frequency modulation signal that is input to a radio frequency power amplifier (not shown). The signal that is input to signal input terminal 1201 is supplied to linear amplifier 1202 and amplifier 1204.

Linear amplifier 1202 linearly amplifies a signal that is input through signal input terminal 1201 and then outputs the resultant signal to signal output terminal 1211. Current detector 1203 detects the output current of linear amplifier 1202 and then outputs a signal that represents the current value.

Amplifier 1204 adjusts the amplitude of the signal that is input through signal input terminal 1201 and then outputs the resultant signal. Amplifier 1205 adjusts the amplitude of the signal detected by current detector 1203 and then outputs the resultant signal. Adder 1206 adds the output signal of amplifier 1204 and the output signal of amplifier 1205 and then outputs the resultant signal. Amplifier 1207 adjusts the amplitude of the signal that is output from adder 1206 and then outputs the resultant signal. PWM modulator 1208 modulates the output signal of amplifier 1207 based on the PWM scheme, converts the signal into a one-bit signal, and then outputs the one-bit signal.

Switching amplifier 1209 amplifies the output signal of PWM modulator 1208 and then outputs the resultant signal to signal output terminal 1211 through inductor 1210. The current of the output signal of switching amplifier 1209 is combined with the current of the output signal of linear amplifier 1202. The power supply circuit shown in FIG. 2 has a structure in which the power supply circuit described in Non-Patent Literature 1 is modified such that the switching amplifier is controlled by a PWM modulator.

It is preferable that the power supply circuit of the foregoing polar modulation power amplifier effectively amplify a wide frequency band of signals ranging from a DC (Direct Current) signal to high frequency signals.

However, it is difficult for power supply circuit 1103 shown in FIG. 1 to widen the frequency bandwidth of signals that can be amplified. In power supply circuit 1103 shown in FIG. 1, the input signal is amplified by linear amplifier 1106. Thus, signals having frequencies that cannot be amplified by linear amplifier 1106 are not output to downstream circuits. In other words, the frequency bandwidth of signals that can be amplified by power supply circuit 1103 substantially depends on the frequency bandwidth of signals that can be amplified by linear amplifier 1106. Thus, it is necessary for linear amplifier 1106, that is able to obtain the desired gain in a wide frequency bandwidth, to widen the frequency bandwidth of signals that can be amplified by power supply circuit 1103. Although the operation frequencies of linear amplifier 1106 can be widened, parts that can be used for linear amplifier 1106 are restricted and thereby the cost of linear amplifier 1106 increases. Thus, it is difficult to widen the operation frequencies of linear amplifier 1106.

Even if the operation frequencies of linear amplifier 1106 are widened, the power efficiency of power supply circuit 1103 including linear amplifier 1106 would deteriorate. For example, a square signal amplified, for example, by switching amplifier 1110 shown in FIG. 1 contains very high frequency components. Thus, switching amplifier 1110 needs to have a sufficient gain for high frequency components contained in the square signal. However, it is difficult to realize switching amplifier 1110 that operates at higher frequencies than linear amplifier 1106 does in a wide frequency band. Even if the frequency bandwidth of signals that can be amplified by linear amplifier 1106 are widened, switching amplifier 1110 would not follow the output signal of linear amplifier 1106 in a radio frequency region.

Thus, in the frequency region where switching amplifier 1110 cannot follow the output signal of linear amplifier 1106, the output power of linear amplifier 1106 that has a lower efficiency than switching amplifier 1110 increases and thereby the overall efficiency of power supply circuit 1103 becomes lower.

Moreover, when switching amplifier 1110 performs a switching operation, the parasitic capacitance of a transistor is charged and discharged. As a result, a power loss will increase. The power loss that occurs in charging and discharging for the parasitic capacitance of a transistor is proportional to the on/off frequency of the transistor, namely the switching frequency. Thus, it is difficult for power supply circuit 1103 shown in FIG. 1 to simultaneously satisfy both widening of the frequency bandwidth of signals that can be amplified and improving power efficiency.

As with power supply circuit 1103 shown in FIG. 1, the power supply circuit shown in FIG. 2 has a similar problem.

Since the power supply circuit shown in FIG. 2 includes both amplifier 1204 and linear amplifier 1202, signals that are input to switching amplifier 1209 are not limited to signals that are amplified by linear amplifier 1202. However, since the output of linear amplifier 1202 is connected to signal output terminal 1211 through current detector 1203, the frequency characteristics of linear amplifier 1202 affect the frequency characteristics of the power supply circuit shown in FIG. 2. Since current detector 1203 is set for a value such that linear amplifier 1202 and signal output terminal 1211 are connected with low power loss, this structure is substantially the same as the structure in which the output of linear amplifier 1202 is directly connected to signal output terminal 1211.

Thus, in the power supply circuit shown in FIG. 2, the frequency bandwidth of signals that can be amplified by linear amplifier 1202 substantially becomes the frequency bandwidth of signals that can be amplified by the power supply circuit. Consequently, the power supply circuit shown in FIG. 2 cannot simultaneously satisfy both widening of the frequency bandwidth of signals that can be amplified and improving power efficiency.

RELATED ART LITERATURE

Non-Patent Literature

Non-patent literature 1: Donald F. Kimbal, Jinho Jeong, Chin Hsia, Paul Draxler, Sandro Lanfranco, Walter Nagy, Kevin Linthicum, Lawrence E. Larson, Peter M. Asbeck, "High-Efficiency Envelope-Tracking W-CDMA Base-Station Amplifier Using GaN HFETs," IEEE TRANSACTIONS, ON MICROWAVE THEORY AND TECHNIQUES, VOL. 54, NO. 11, NOVEMBER 2006, pp. 3848-3856.

Non-Patent Literature 2: Tae-Woo Kwak, Min-Chul Lee, Bae-Kun Choi, Hanh-Phuc Le, Gyu-Hyeong Cho, "A 2W COMS Hybrid Switching Amplitude Modulator for EDGE Polar Transmitters," IEEE International Solid-State Circuits Conference 2007, pp. 518-519.

SUMMARY

Therefore, an object of the present invention is to provide power supply circuits that have a wide frequency bandwidth and an excellent power efficiency.

To accomplish the foregoing object, a power supply circuit according to an exemplary aspect of the present invention includes:

a first power amplifier that amplifies an input signal;

a high pass filter that removes frequency components that are lower than a predetermined first cutoff frequency from an output signal of said first power amplifier;

a current detector that detects a current value of the output signal of said first power amplifier;

a composite signal generation circuit that combines said input signal and an output signal of said current detector;

a second power amplifier that amplifies an output signal of said composite signal generation circuit;

a low pass filter that removes frequency components that are higher than a predetermined second cutoff frequency from an output signal of said second power amplifier; and a signal output terminal that combines a current of an output signal of said high pass filter and a current of an output signal of said low pass filter and then outputs the resultant signal.

EXEMPLARY EMBODIMENT

Next, with reference to the accompanying drawings, the present invention will be described.

First Exemplary Embodiment

Figure 1:
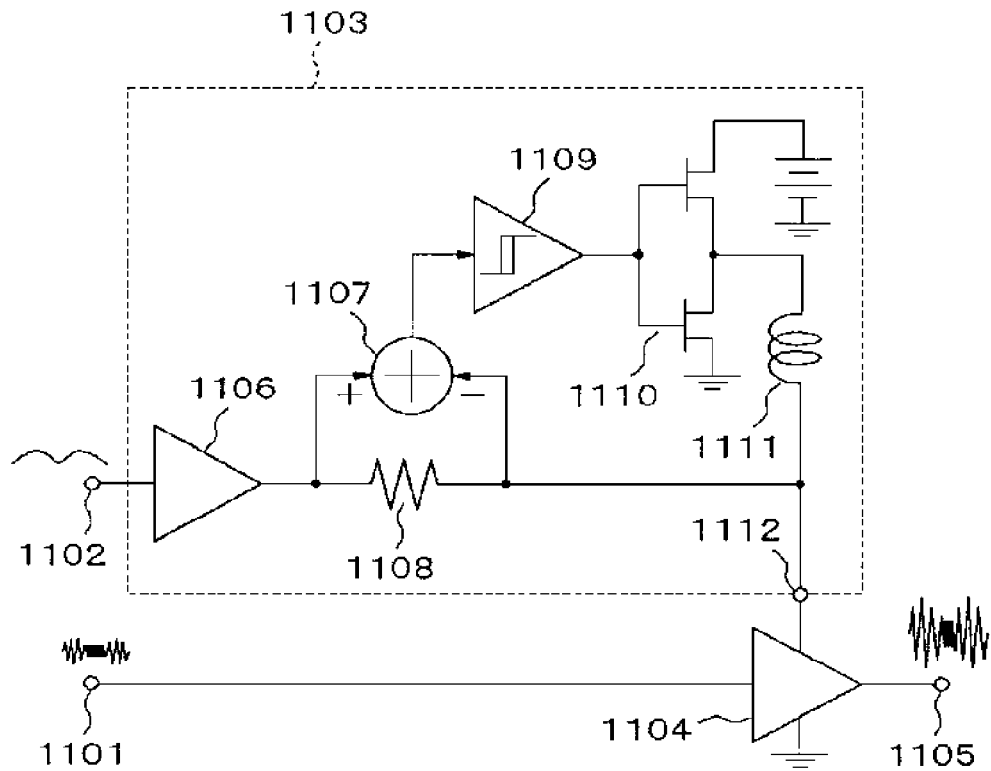
FIG. 1 is a circuit diagram showing the structure of a polar modulation power amplifier described as a related art reference in Non-Patent Literature 1.
Figure 2:
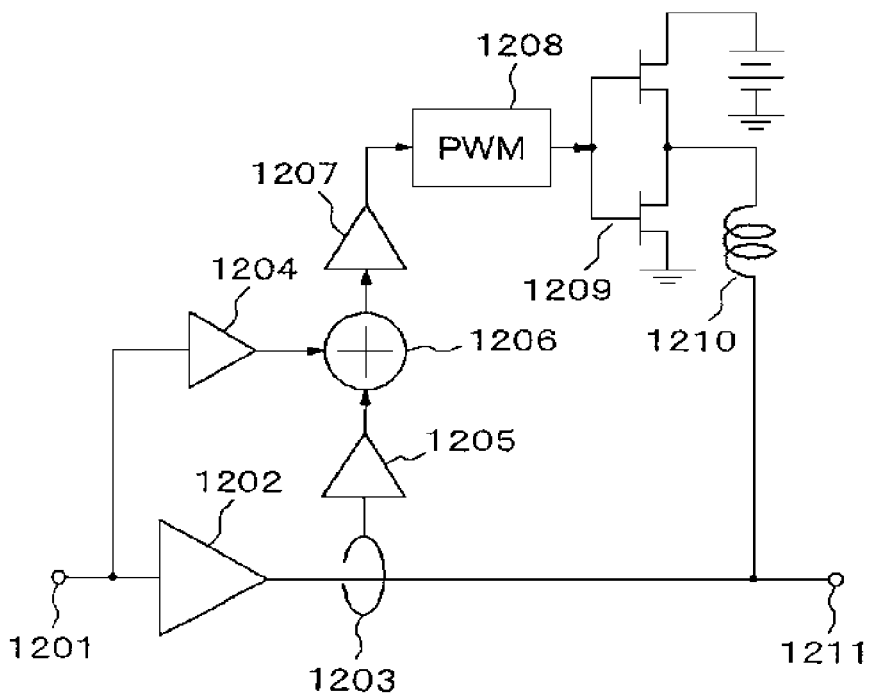
FIG. 2 is a circuit diagram showing the structure of a power supply circuit described as a related art reference in Non-Patent Literature 2.
Figure 3:
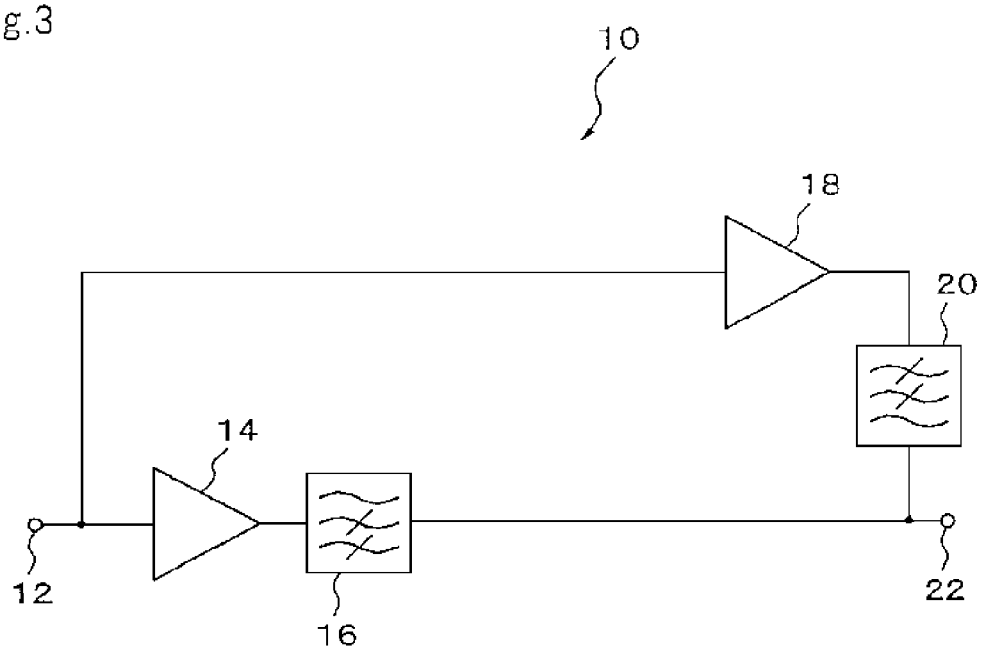
FIG. 3 is a block diagram showing an example of the structure of a power supply circuit according to a first exemplary embodiment of the present invention.

FIG. 3 is a block diagram showing an example of the structure of a power supply circuit according to a first exemplary embodiment of the present invention.

As shown in FIG. 3, power supply circuit 10 according to the first exemplary embodiment includes signal input terminal 12, first power amplifier 14, high pass filter 16, second power amplifier 18, low pass filter 20, and signal output terminal 22.

Input to signal input terminal 12 is a signal to be amplified (for example, an amplitude signal that is an amplitude component of a radio frequency modulation signal).

First power amplifier 14 and second power amplifier 18 amplifies a signal that is input to signal input terminal 12.

High pass filter 16 shuts off low frequency components that are lower than the predetermined cutoff frequency (first cutoff frequency) of the signal that is amplified by first power amplifier 14 and then outputs a signal that contains high frequency components. In contrast, low pass filter 20 shuts off high frequency components that are higher than the predetermined cutoff frequency (second cutoff frequency) of the signal amplified by second power amplifier 18 and then outputs a signal that contains only low frequency components. The current of the output signal of high pass filter 16 and the current of the output signal of low pass filter 20 are combined and then output from signal output terminal 22.

First power amplifier 14 may be a linear amplifier corresponding to class A, class B, or the like. Second power amplifier 18 may be a switching amplifier corresponding to class D or the like. Generally, a class A or class B amplifier can relatively easily amplify power of higher frequency signals than a class D amplifier. A class D amplifier can highly efficiently amplify power of lower frequency signals than a class A or class B amplifier.

According to the first exemplary embodiment, power supply circuit 10 that includes two power amplifiers divides the frequency band of signals amplified by the two power amplifiers and then causes one power amplifier to amplify a low frequency signal and the other power amplifier to amplify a high frequency signal so as to widen the frequency band of signals amplified by power supply circuit 10.

In addition, since the frequency band of signals amplified by two power amplifiers is divided, the operation frequencies of second power amplifier 18, namely the switching amplifier, can be kept low. Thus, in a frequency region where the switching amplifier does not operate, since the output power of the linear amplifier having low efficiency does not increase, the entire efficiency of power supply circuit 10 can be prevented from becoming lower.

As a result, power supply circuit 10 that has a wide frequency bandwidth and high power efficiency can be realized.

It is preferable that the cutoff frequency of high pass filter 16 be set equal to or lower than the cutoff frequency of low pass filter 20. In other words, it is preferable that the cutoff frequency of high pass filter 16 is equal to or lower than the cutoff frequency of low pass filter 20 and that the pass bands of the filters overlap with each other.

If the cutoff frequency of high pass filter 16 does not match the cutoff frequency of low pass filter 20 or if the pass bands of high pass filter 16 do not overlap with low pass filter 20, the output impedance of power supply circuit 10 becomes high between the cutoff frequencies of the two filters. In the following description, the state in which the cutoff frequency of high pass filter 16 does not match the cutoff frequency of low pass filter 20 or the state in which the pass bands of high pass filter 16 do not overlap with low pass filter 20 is referred to as "the pass bands of the individual filters are completely isolated from each other."

Since power supply circuit 10 is expected to operate as a voltage source in the frequency band of all signals to be amplified, if there is a frequency region where the output impedance becomes high, a critical defect occurs. Thus, if the pass frequency band of high pass filter 16 is completely isolated from the pass band of low pass filter 20, the usefulness of power supply circuit 10 deteriorates.

In power supply circuit 10 shown in FIG. 3, it is more preferable that the total gain of first power amplifier 14 and high pass filter 16 match the total gain of second power amplifier 18 and low pass filter 20. As described above, since first power amplifier 14 and second power amplifier 18 amplify signals in their divided frequency bands, if the gains of two amplification paths do not match each other, the signal that is input to signal input terminal 12 will not become similar to the signal that is output from signal output terminal 22.

Second Exemplary Embodiment

Figure 4:
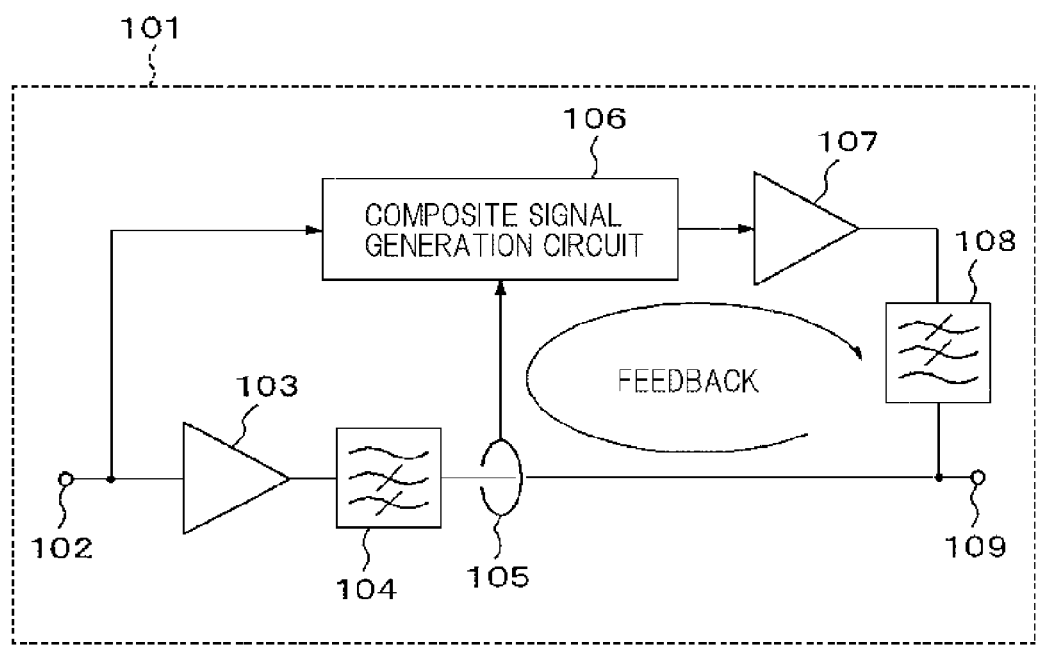
FIG. 4 is a block diagram showing an example of the structure of a power supply circuit according to a second exemplary embodiment of the present invention.

FIG. 4 is a block diagram showing an example of the structure of a power supply circuit according to a second exemplary embodiment of the present invention.

As shown in FIG. 4, power supply circuit 101 according to the second exemplary embodiment includes signal input terminal 102, first power amplifier 103, high pass filter 104, current detector 105, composite signal generation circuit 106, second power amplifier 107, low pass filter 108, and signal output terminal 109.

Input to signal input terminal 102 is a signal to be amplified (for example, an amplitude signal that is an amplitude component of a radio frequency modulation signal).

First power amplifier 103 amplifies the signal that is input to signal input terminal 102.

High pass filter 104 shuts off low frequency components that are lower than the predetermined cutoff frequency (first cutoff frequency) of the signal that is amplified by first power amplifier 103 and then outputs a signal that contains only high frequency components.

Current detector 105 detects a current value of the signal that is output from high pass filter 104 and then outputs a signal that represents the current value.

Composite signal generation circuit 106 combines the signal that represents the output current of first power amplifier 103, the signal being detected by current detector 105, with the signal that is input to signal input terminal 102.

Second power amplifier 107 amplifies a signal that is output from composite signal generation circuit 106.

Low pass filter 108 shuts off high frequency components that are higher than a predetermined cutoff frequency (second cutoff frequency) of the signal amplified by second power amplifier 107 and then outputs a signal that contains only low frequency components.

The current of the output signal of high pass filter 104 and the current of the output signal of low pass filter 108 are combined and then the resultant signal is output from signal output terminal 109.

In power supply circuit 101 according to this exemplary embodiment, first power amplifier 103 and second power amplifier 107 operate as voltage sources. It is assumed that the output impedances of first power amplifier 103 and second power amplifier 107 are low. In addition, it is assumed that the power loss in the predetermined pass bands of high pass filter 104 and low pass filter 108 is low.

Moreover, in power supply circuit 101 according to this exemplary embodiment, a feedback circuit is formed in an amplification path composed of current detector 105, composite signal generation circuit 106, second power amplifier 107, and low pass filter 108. The feedback circuit causes second power amplifier 107 to operate as a current source and also stabilizes the operation of power supply circuit 101.

Next, the effect of the foregoing feedback circuit will be described using power supply circuit 101 that does not include a feedback circuit.

Unless power supply circuit 101 includes the foregoing feedback circuit, it becomes very difficult to combine output signals of a plurality of power amplifiers that have low output impedance values and low power loss. This is because first power amplifier 103 and second power amplifier 107 are independently operated, not controlled such that they are interlocked.

For example, it is assumed that the voltage difference between the output signal of first power amplifier 103 and the output signal of second power amplifier 107 is represented by dV and that the sum of the output impedance of first power amplifier 103 and the output impedance of second power amplifier 107 is represented by R. At this point, the current of dV/R flows between first power amplifier 103 and second power amplifier 107. At this point, if the output impedances of first power amplifier 103 and second power amplifier 107 are low, a large current will flow between first power amplifier 103 and second power amplifier 107. The current that flows between first power amplifier 103 and second power amplifier 107 is not output from signal output terminal 109 to the outside, but becomes a power loss of power supply circuit 101.

It is difficult to prevent voltage difference dV between the output signal of first power amplifier 103 and the output signal of second power amplifier 107 from occurring in a real electronic circuit. Voltage difference dV occurs unless production tolerance of transistors, resistors, and so forth, parasitic components, and gain differences and propagation delay differences are completely removed. In addition, it is difficult to control voltage difference dV that occurs in production tolerance and parasitic components. This problem also occurs even if high pass filter 104 is connected to the output of first power amplifier 103 and low pass filter 108 is connected to the output of second power amplifier 107.

If the pass band of high pass filter 104 overlaps with the pass band of low pass filter 108, a similar power loss occurs in the overlapped frequency band.

On the other hand, if the pass band of high pass filter 104 is completely isolated from the pass band of low pass filter 108, the foregoing problem of the power loss does not occur. This is because sum R of output impedances of all frequency bands is large.

However, if the pass band of high pass filter 104 is completely isolated from the pass band of low pass filter 108, the output impedance of power supply circuit 101 becomes high between the cutoff frequencies of the two filters.

Since power supply circuit 101 is expected to operate as a voltage source in the frequency band of all signals to be amplified, if there is a frequency region where the output impedance becomes high, a critical defect occurs. Thus, if the pass band of high pass filter 16 is completely isolated from the pass band of low pass filter 20, the usefulness of power supply circuit 101 will deteriorate.

Figure 5:
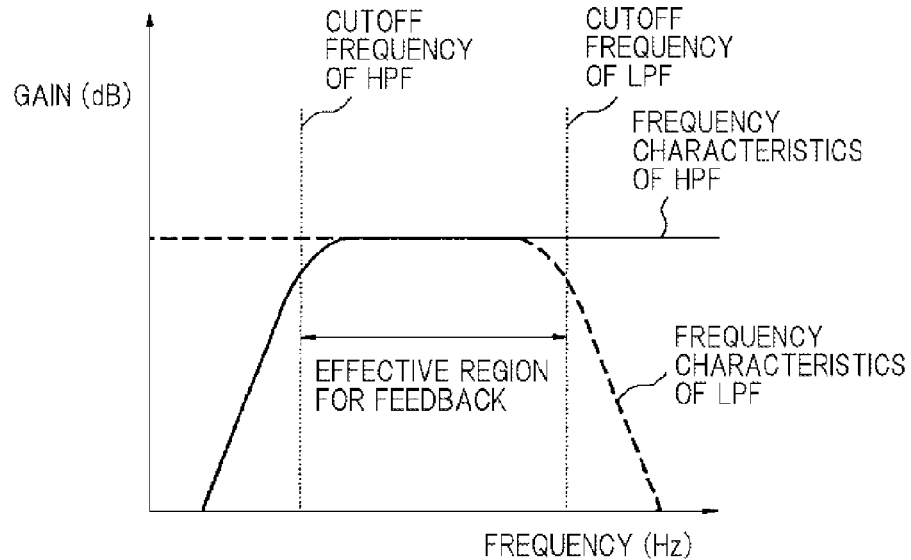
FIG. 5 is a graph showing a designing method for cutoff frequencies of a high pass filter and a low pass filter shown in FIG. 4.

The feedback circuit of power supply circuit 101 shown in FIG. 4 is to solve this problem. FIG. 5 shows a graph of frequency characteristics of gains of the amplification path composed of first power amplifier 103 and high pass filter 104 and the amplification path composed of composite signal generation circuit 106, second power amplifier 107, and low pass filter 108. More specifically, the graph shows the relationship of the gains and cutoff frequencies of the individual amplification paths and the frequency band of the feedback circuit. The cutoff frequencies of the individual amplification paths depend on the cutoff frequencies of high pass filter 104 and low pass filter 108.

In the example shown in FIG. 5, the gains of first power amplifier 103, composite signal generation circuit 106, and second power amplifier 107 are set such that the gains of the two amplification paths match each other in a frequency region where the pass band of high pass filter 104 overlaps with the pass band of low pass filter 108. In addition, the cutoff frequency of high pass filter 104 is set to a frequency that is lower than the cutoff frequency of low pass filter 108.

In power supply circuit 101 shown in FIG. 4, current detector 105 detects the output current of first power amplifier 103. Composite signal generation circuit 106 controls the output voltage of second power amplifier 107 such that the output current of first power amplifier 103 becomes minimum. Thus, first power amplifier 103 decides the output voltage of signal output terminal 109 in the frequency region where the pass band of high pass filter 104 overlaps with the pass band of low pass filter 108. As a result, second power amplifier 107 follows the operation of first power amplifier 103.

Although such a feedback control causes the foregoing voltage difference dV to occur, the voltage difference depends on the gain of the foregoing feedback circuit, not projection tolerance of transistors, resistors, and so forth and parasitic components. Thus, the feedback circuit allows the operation of first power amplifier 103 to be interlocked with the operation of second power amplifier 107 so as to control the value of current (dV/R) that flows between first power amplifier 103 and second power amplifier 107.

In power supply circuit 101 shown in FIG. 4, first power amplifier 103 operates as a voltage source having a low output impedance in the frequency region where the pass band of high pass filter 104 does not overlap with the pass band of low pass filter 108 in the pass band of high pass filter 104 and decides the voltage that is output from signal output terminal 109. Likewise, second power amplifier 107 operates as a voltage source having a low output impedance in the frequency region where the pass band of low pass filter 108 does not overlap with the pass band of high pass filter 104 in the pass band of second power amplifier 107 and decides the voltage that is output from signal output terminal 109. In such frequency regions, first power amplifier 103 and second power amplifier 107 simply amplify the input signals in their operation frequency bands, but do not contribute to the operation of the foregoing feedback circuit. Thus, if the pass band of high pass filter 104 does not overlap with the pass band of low pass filter 108, the foregoing feedback control becomes unnecessary. In other words, the foregoing feedback circuit is used if the pass band of high pass filter 104 overlaps with the pass band of low pass filter 108, namely so as to solve the problem (power consumption of voltage difference dV) that occurs in the frequency regions where first power amplifier 103 and second power amplifier 107 operate in the low output impedance state.

As with the first exemplary embodiment, first power amplifier 103 may be a linear amplifier corresponding to class A, class B, or the like. Second power amplifier 107 may be a switching amplifier corresponding to class D or the like. Generally, a class A or class B amplifier can relatively easily amplify power of higher frequency signals than a class D amplifier. A class D amplifier can highly efficiently amplify power of lower frequency signals than a class A or class B amplifier.

As with the first exemplary embodiment, according to the second exemplary embodiment, since power supply circuit 101 that includes two power amplifiers divides the frequency band of signals amplified by the two power amplifiers and then causes one power amplifier to amplify a low frequency signal and the other power amplifier to amplify a high frequency signal, power supply circuit 101 can easily obtain the advantages of the two types of the power amplifiers. As a result, power supply circuit 101 has a wide frequency bandwidth and a high power efficiency. This feature can be applied to third to fifth exemplary embodiments that follow.

A main function of composite signal generation circuit 106 shown in FIG. 4 is to combine a signal that is input to signal input terminal 102 with an output signal of current detector 105 and then to output the resultant signal. At this point, composite signal generation circuit 106 has a function that adjusts the ratio of two signals that are combined. If second power amplifier 107 is a switching amplifier corresponding to class D or the like, composite signal generation circuit 106 also has a function that converts the resultant signal into a one-bit pulse pattern.

Figure 6:
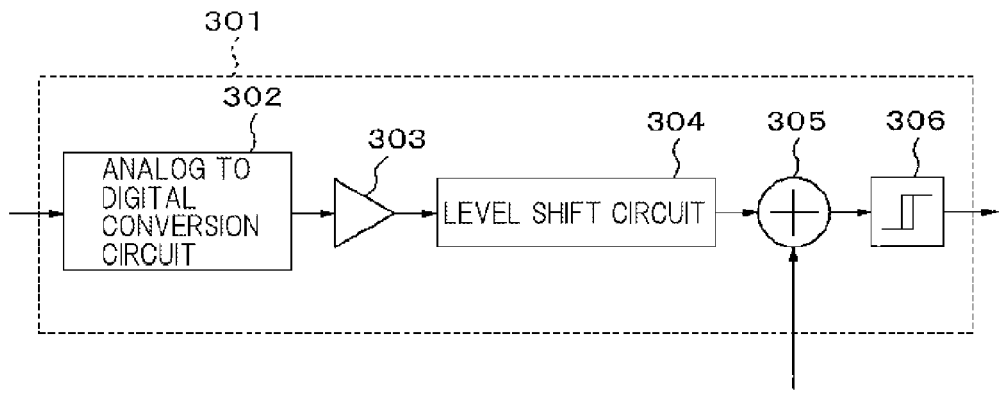
FIG. 6 is a block diagram showing a first example of the structure of a composite signal generation circuit shown in FIG. 4.

FIG. 6 is a block diagram showing a first example of the structure of the composite signal generation circuit shown in FIG. 4.

As shown in FIG. 6, composite signal generation circuit 301, as the first example of the structure, includes analog to digital conversion circuit 302, amplifier 303, level shift circuit 304, adder 305, and comparator 306.

Analog to digital conversion circuit 302 converts a signal (analog signal) that is input to signal input terminal 102 into a digital signal and then outputs the resultant signal.

Amplifier 303 adjusts the amplitude of an output signal of analog to digital conversion circuit 302 and then outputs the resultant signal.

Level shift circuit 304 adjusts the DC voltage of a signal that is output from amplifier 303. In composite signal generation circuit 301 shown in FIG. 6, the DC voltage of the signal that is output from amplifier 303 may not match the DC voltage of the signal that is input to comparator 306. Level shift circuit 304 causes the center value of the DC voltage that is output from amplifier 303 to match the reference voltage of comparator 306. If the output signal of amplifier 303 is a one-bit signal having 0 V and 1 V and the reference voltage of comparator 306 is 0 V, level shift circuit 304 outputs a pulse signal having the amplitude of −0.5 V to 0.5 V with a center voltage of 0 V.

Adder 305 adds the output signal of level shift circuit 304 and the output signal of current detector 105 and then outputs the resultant signal.

Comparator 306 compares an output signal of adder 305 with the predetermined reference voltage. If the output voltage of adder 305 is greater than the reference voltage, comparator 306 outputs High. In contrast, if the output voltage of adder 305 is lower than the reference voltage, comparator 306 outputs Low. An output signal of comparator 306 is supplied to second power amplifier 107.

Analog to digital conversion circuit 302 may be a known delta-sigma converter or the like that outputs a one-bit pulse pattern. Comparator 306 may be a hysteresis comparator having a hysteresis characteristic (hysteresis width V_hys). If the signal level of the immediately preceding output signal is Low, when the voltage of the input signal becomes equal to or greater than V_hys/2 in comparison with the reference voltage, the signal level of the output signal is inverted to High. If the signal level of the immediately preceding output signal is High, when the voltage of the input signal becomes equal to or lower than −V_hys/2 in comparison with the reference voltage, the signal level of the output signal is inverted to Low.

Figure 7:
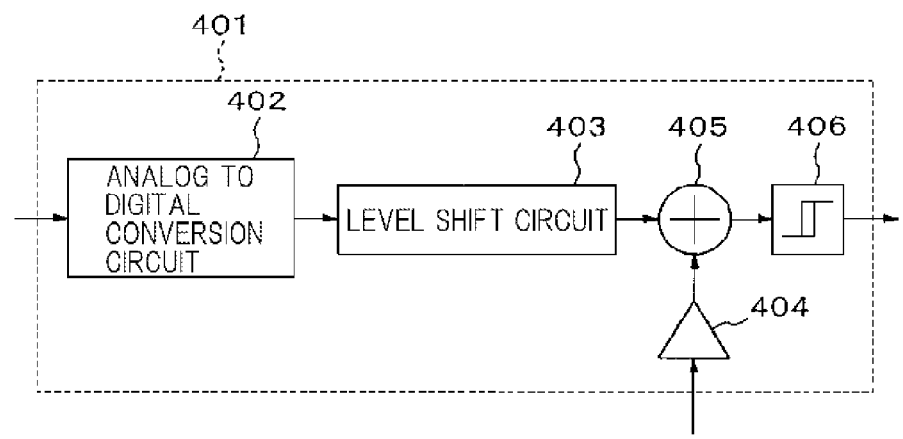
FIG. 7 is a block diagram showing a second example of the structure of the composite signal generation circuit shown in FIG. 4.

FIG. 7 is a block diagram showing a second example of the structure of the composite signal generation circuit shown in FIG. 4.

As shown in FIG. 7, composite signal generation circuit 401 as the second example of the structure includes analog to digital conversion circuit 402, level shift circuit 403, amplifier 404, adder 405, and comparator 406.

Analog to digital conversion circuit 402 converts a signal (analog signal) that is input to signal input terminal 102 into a digital signal and then outputs the resultant signal.

Level shift circuit 403 adjusts a DC voltage of a signal that is output from analog to digital conversion circuit 402. In composite signal generation circuit 401 shown in FIG. 7, the DC voltage of the signal that is output from analog to digital conversion circuit 402 may not match the DC voltage of the signal that is input to comparator 406. Level shift circuit 403 causes the center value of the DC voltage that is output from analog to digital conversion circuit 402 to match the reference voltage of comparator 406. If the output signal of analog to digital conversion circuit 402 is a one-bit signal having 0 V and 1 V and the reference voltage of comparator 406 is 0 V, level shift circuit 403 will output a pulse signal having an amplitude of −0.5 V to 0.5 V with a center voltage of 0 V.

Amplifier 404 appropriately adjusts the amplitude of the signal that is output from current detector 105 shown in FIG. 4 such that the signal can be added by adder 405. Alternatively, amplifier 404 may be omitted.

Adder 405 adds the output signal of level shift circuit 403 and the output signal of amplifier 404 and then outputs the resultant signal.

Comparator 406 compares the output signal of adder 405 with the predetermined reference voltage. If the output voltage of adder 405 is greater than the reference voltage, comparator 406 outputs High. In contrast, if the output voltage of adder 405 is lower than the reference voltage, comparator 406 outputs Low. An output signal of comparator 406 is supplied to second power amplifier 107.

Analog to digital conversion circuit 402 may be a known delta-sigma converter or the like that outputs a one-bit pulse pattern. Comparator 406 may be a hysteresis comparator having a hysteresis characteristic (hysteresis width V_hys). If the signal level of the immediately preceding output signal is Low, when the voltage of the input signal becomes equal to or greater than V_hys/2 in comparison with the reference voltage, the signal level of the output signal is inverted to High. If the signal level of the immediately preceding output signal is High, when the voltage of the input signal becomes equal to or lower than −V_hys/2 in comparison with the reference voltage, the signal level of the output signal is inverted to Low.

Figure 8:
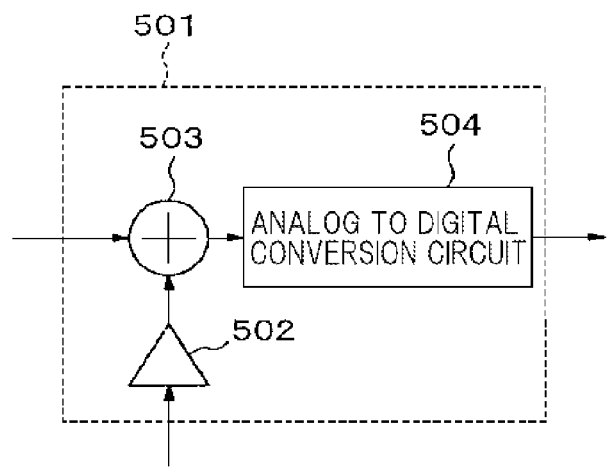
FIG. 8 is a block diagram showing a third example of the structure of the composite signal generation circuit shown in FIG. 4.

FIG. 8 is a block diagram showing a third example of the structure of the composite signal generation circuit shown in FIG. 4.

As shown in FIG. 8, composite signal generation circuit 501 as the third example of the structure includes amplifier 502, adder 503, and analog to digital conversion circuit 504.

Amplifier 502 appropriately adjusts the amplitude of the signal that is output from current detector 105 shown in FIG. 4 such that the signal can be added by adder 503. Alternatively, amplifier 502 may be omitted.

Adder 503 adds the signal that is input to signal input terminal 102 and the output signal of amplifier 502 and then outputs the resultant signal.

Analog to digital conversion circuit 504 converts the output signal (analog signal) of adding unit 503 into a digital signal and then outputs the resultant signal. The output signal of analog to digital conversion circuit 504 is supplied to second power amplifier 107. Analog to digital conversion circuit 504 may be a known delta-sigma converter or the like that outputs a one-bit pulse pattern.

A feedback control according to the second exemplary embodiment is effective not only if the pass band of high pass filter 104 overlaps with the pass band of low pass filter 108, but also if the cutoff frequency of high pass filter 104 is equal to the cutoff frequency of low pass filter 108.

As described above, if the pass band of high pass filter 104 does not overlap with the pass band of low pass filter 108, the foregoing feedback control becomes unnecessary. In this case, even if power supply circuit 101 includes current detector 105 and composite signal generation circuit 106 shown in FIG. 4, power supply circuit 101 will operate properly.

As with the first exemplary embodiment, in power supply circuit 101 according to the second exemplary embodiment, it is more preferable that the total gain of first power amplifier 103 and high pass filter 104 match the total gain of second power amplifier 107 and low pass filter 108. However, even if these total gains do not match each other, the purpose of the present invention can be realized.

Third Exemplary Embodiment

Figure 9:
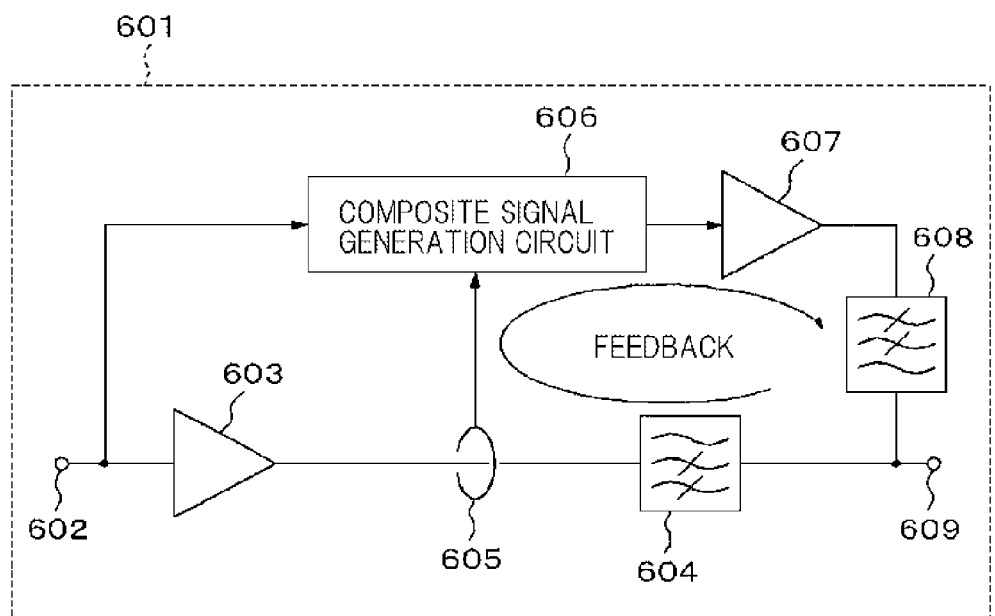
FIG. 9 is a block diagram showing an example of the structure of a power supply circuit according to a third exemplary embodiment of the present invention.

FIG. 9 is a block diagram showing an example of the structure of a power supply circuit according to a third exemplary embodiment of the present invention.

As shown in FIG. 9, power supply circuit 601 according to the third exemplary embodiment includes signal input terminal 602, first power amplifier 603, current detector 605, high pass filter 604, composite signal generation circuit 606, second power amplifier 607, low pass filter 608, and signal output terminal 609.

A signal that is to be amplified (for example, an amplitude signal that is an amplitude component of a radio frequency modulation signal) is input to signal input terminal 602.

First power amplifier 603 amplifies the signal that is input to signal input terminal 602.

Current detector 605 detects the current value of the signal that is output from first power amplifier 603 and then outputs a signal that represents the current value.

High pass filter 604 shuts off low frequency components that are lower than a predetermined cutoff frequency (first cutoff frequency) of the signal that is amplified by first power amplifier 603 and then outputs a signal that contains only high frequency components.

Composite signal generation circuit 606 combines the signal that represents the output current of first power amplifier 603, the signal being detected by current detector 605, with the signal that is input to signal input terminal 602.

Second power amplifier 607 amplifies a signal that is output from composite signal generation circuit 606.

Low pass filter 608 shuts off high frequency components that are higher than the predetermined cutoff frequency of the signal amplified by second power amplifier 607 and then outputs a signal that contains only low frequency components.

The current of the output signal of high pass filter 604 and the current of the output signal of low pass filter 608 are combined and then the resultant signal is output from signal output terminal 609.

Power supply circuit 601 according to the third exemplary embodiment shown in FIG. 9 is different from power supply circuit 101 according to the second exemplary embodiment shown in FIG. 4 in that the positions of current detector 105 and high pass filter 104 are substituted for each other. Although the positions of current detector 105 and high pass filter 104 are substituted for each other, power supply circuit 601 according to the third exemplary embodiment operates as in the case of power supply circuit 101 according to the second exemplary embodiment.

As with the second exemplary embodiment, composite signal generation circuit 606 shown in FIG. 9 may be composite signal generation circuit 301, 401, or 501 respectively shown in FIG. 6 to FIG. 8.

Fourth Exemplary Embodiment

Figure 10:
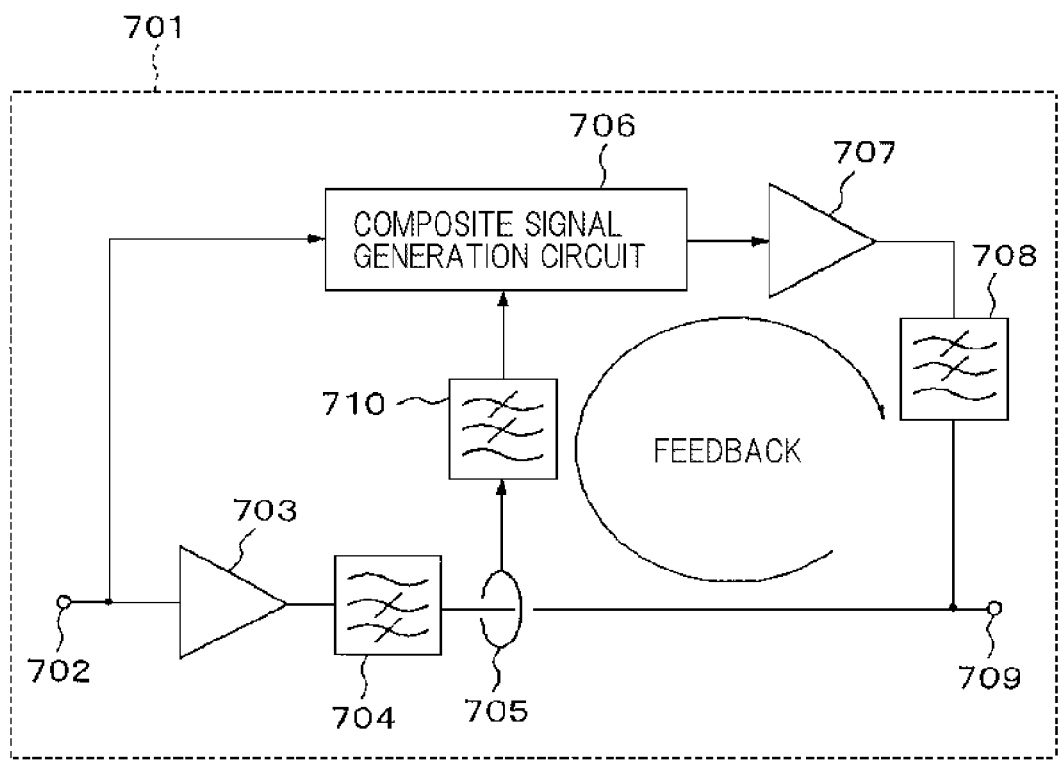
FIG. 10 is a block diagram showing an example of the structure of a power supply circuit according to a fourth exemplary embodiment of the present invention.

FIG. 10 is a block diagram showing an example of the structure of a power supply circuit according to a fourth exemplary embodiment of the present invention.

As shown in FIG. 10, power supply circuit 701 according to the fourth exemplary embodiment includes signal input terminal 702, first power amplifier 703, high pass filter 704, current detector 705, first low pass filter 710, composite signal generation circuit 706, second power amplifier 707, second low pass filter 708, and signal output terminal 709.

Input to signal input terminal 702 is a signal to be amplified (for example, an amplitude signal that is an amplitude component of a radio frequency modulation signal).

First power amplifier 703 amplifies the signal that is input to signal input terminal 702 and then outputs the resultant signal to signal output terminal 709 through high pass filter 704.

Current detector 705 detects the current value of the signal that is output from high pass filter 704 and then outputs a signal that represents the current value.

First low pass filter 710 removes high frequency components from the signal that represents the output current of first power amplifier 703, the signal being detected by current detector 705.

Composite signal generation circuit 706 combines the output signal of first low pass filter 710 with the signal that is input to signal input terminal 702.

Second power amplifier 707 amplifies the signal that is output from composite signal generation circuit 706 and then outputs the resultant signal to signal output terminal 709 through second low pass filter 708. The current of the signal that is output from high pass filter 704 and the current of the signal that is output from second low pass filter 708 are combined and then output from signal output terminal 709.

Power supply circuit 701 according to the fourth exemplary embodiment also includes a low pass filter located between current detector 105 and composite signal generation circuit 106 of power supply circuit 101 according to the second exemplary embodiment shown in FIG. 4.

In power supply circuit 101 according to the second exemplary embodiment shown in FIG. 4, a feedback circuit is formed in an amplification path composed of current detector 105, composite signal generation circuit 106, second power amplifier 107, and low pass filter 108. The pass band of signals amplified in the feedback circuit depends on low pass filter 108. The feedback operation is not valid outside the pass band of low pass filter 108.

In power supply circuit 701 according to the fourth exemplary embodiment shown in FIG. 10, a feedback circuit is formed in an amplification path composed of current detector 705, first low pass filter 710, composite signal generation circuit 706, second power amplifier 707, and second low pass filter 708.

Since first low pass filter 710 is located between current detector 705 and composite signal generation circuit 706, high frequency components that are not necessary for the amplification operation of second power amplifier 707 can be removed from the signal supplied to composite signal generation circuit 706. Thus, the accuracy of the feedback control can be improved.

As with power supply circuit 601 according to the third exemplary embodiment shown in FIG. 9, in power supply circuit 701 according to the fourth exemplary embodiment, the positions of high pass filter 704 and current detector 705 may be substituted for each other. In this case, current detector 705 is located immediately downstream of first power amplifier 703. Located immediately downstream of current detector 705 is high pass filter 704. In such a structure, first low pass filter 710 is located between current detector 705 and composite signal generation circuit 706.

As with the second exemplary embodiment, composite signal generation circuit 706 shown in FIG. 10 may be composite signal generation circuit 301, 401, or 501 respectively shown in FIG. 6 to FIG. 8.

Fifth Exemplary Embodiment

Figure 11:
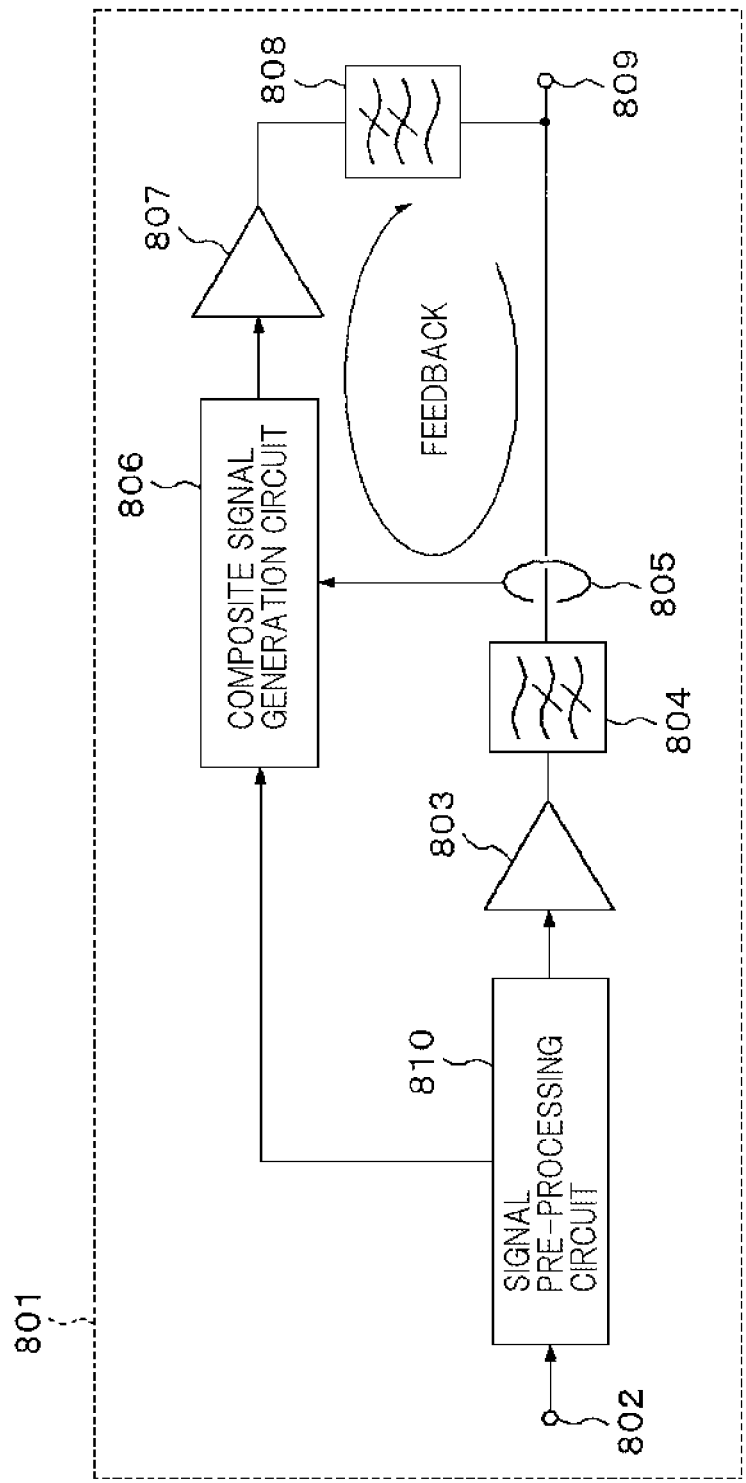
FIG. 11 is a block diagram showing an example of the structure of a power supply circuit according to a fifth exemplary embodiment of the present invention.

FIG. 11 is a block diagram showing an example of the structure of a power supply circuit according to a fifth exemplary embodiment of the present invention.

As shown in FIG. 11, power supply circuit 801 according to the fifth exemplary embodiment includes signal pre-processing circuit 810, signal input terminal 802, first power amplifier 803, high pass filter 804, current detector 805, composite signal generation circuit 806, second power amplifier 807, low pass filter 808, and signal output terminal 809.

Input to signal input terminal 802 is a signal to be amplified (for example, an amplitude signal that is an amplitude component of a radio frequency modulation signal).

Signal pre-processing circuit 810 performs signal processes for the signal that is input to signal input terminal 802 such that first power amplifier 803 and second power amplifier 807 can appropriately amplify signals. Thereafter, signal pre-processing circuit 810 outputs the resultant signal to first power amplifier 803 and composite signal generation circuit 806. The signal processes suitable for signal amplification includes a process that adjusts relative delay times for signals distributed to individual amplification paths and band control processes (band control processes of low pass filter 903 and high pass filter 904) as will be described later.

First power amplifier 803 amplifies the signal that is output from signal pre-processing circuit 810 and then outputs the resultant signal to signal output terminal 809 through high pass filter 804.

Current detector 805 detects the current value of the signal that is output from high pass filter 804 and then outputs a signal that represents the current value.

Composite signal generation circuit 806 combines the signal that represents the output current of first power amplifier 803, the signal being detected by current detector 805, with the signal that is output from signal pre-processing circuit 810.

Second power amplifier 807 amplifies the signal that is output from composite signal generation circuit 806 and then outputs the resultant signal to signal output terminal 809 through low pass filter 808. At this point, the current of the output signal of high pass filter 804 and the current of the output signal of low pass filter 808 are combined and the resultant signal is output from signal output terminal 809.

Signal pre-processing circuit 810 performs signal processes that limit the band of signals (filtering) and correct delay amounts that occur in the downstream amplification paths.

Figure 12:
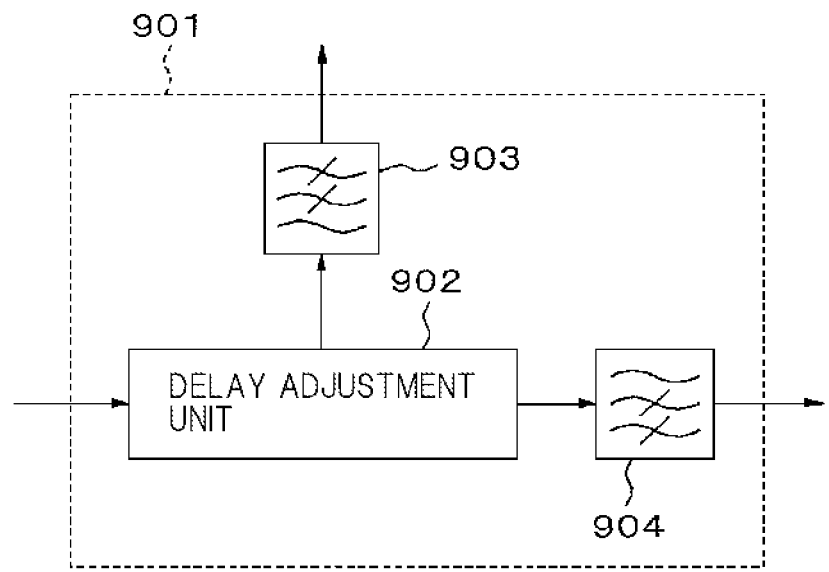
FIG. 12 is a block diagram showing an example of the structure of a signal pre-processing circuit of the power supply circuit shown in FIG. 11.

FIG. 12 is a block diagram showing an example of the structure of the signal pre-processing circuit shown in FIG. 11.

As shown in FIG. 12, signal pre-processing circuit 901 includes delay adjustment unit 902, low pass filter 903, and high pass filter 904.

Delay adjustment unit 902 distributes an input signal to low pass filter 903 and high pass filter 904. Delay adjustment unit 902 adjusts relative delay times of signals distributed to low pass filter 903 and high pass filter 904.

Low pass filter 903 removes high frequency components from the output signal of delay adjustment unit 902 and then outputs the resultant signal to composite signal generation circuit 806 shown in FIG. 11. High pass filter 904 removes low frequency components from the output signal of delay adjustment unit 902 and then outputs the resultant signal to first power amplifier 803 shown in FIG. 11.

Delay adjustment unit 902 shown in FIG. 12 causes the phases of the two output signals of high pass filter 804 and low pass filter 808 to match each other. One signal distributed by delay adjustment unit 902 is supplied to a first amplification path that includes high pass filter 904, first power amplifier 803, high pass filter 804, and current detector 805. The other signal distributed by delay adjustment unit 902 is supplied to a second amplification path that includes low pass filter 903, composite signal generation circuit 806, second power amplifier 807, and low pass filter 808.

Delay adjustment unit 902 corrects the delay times of the signals that are output to the first amplification path and the second amplification path such that the delay time for which the first signal is output from signal output terminal 809 through the first amplification path matches the delay time for which the second signal is output from signal output terminal 809 through the second amplification path. Since the signals are corrected in the foregoing manner, the phase difference between the signal that is output from the first amplification path and the signal that is output from the second amplification path can be decreased as long as power efficiency and linearity are not affected.

Unless the signal that is output from signal output terminal 809 becomes 0 V, the power efficiency of power supply circuit 801 of signal pre-processing circuit 901 shown in FIG. 11 can be improved. If the maximum amplitude and minimum amplitude of the output signal of signal output terminal 809 are V_max and V_min (where V_min>0) respectively, the bias voltage of first power amplifier 803 is at least V_max−V_min. Since high pass filter 904 of signal pre-processing circuit 901 removes frequency components in the neighborhood of DC, the peak-to-peak voltage of the output signal of first power amplifier 803 becomes V_max−V_min V with a center voltage of 0 V.

In contrast, if signal pre-processing circuit 901 does not include high pass filter 904, first power amplifier 803 needs to output a signal having a voltage ranging from 0 V to V_max V, and first power amplifier 803 needs to have a bias voltage of at least V_max V. If the output power does not vary, the efficiency of a class A or class B amplifier used as first power amplifier 803 will be reversely proportional to the bias voltage. Thus, since the power efficiency of first power amplifier 803 is improved, the power efficiency of power supply circuit 801 including signal pre-processing circuit 901 shown in FIG. 11 can be improved.

Signal pre-processing circuit 901 may include a level shift circuit instead of high pass filter 904. The level shift circuit may have a function that adjusts the amplitude signal having an amplitude ranging from V_max V to V_min V that is output from first power amplifier 803 located downstream of signal pre-processing circuit 901 to an amplitude signal having an amplitude ranging from V_max V to V_min V with a center voltage of any voltage. In this case, first power amplifier 803 may output a signal having an amplitude of an (V_max−V_min) V with a center voltage of (V_max−V_min)/2 V.

Signal pre-processing circuit 901 may not include low pass filter 903 and/or high pass filter 904. In this case, delay adjustment unit 902 may adjust the delay times of signals that are output to the amplification paths such that the phase of the amplification path including first power amplifier 803 matches the phase of the amplification path including second power amplifier 807.

As with power supply circuit 101 according to the second exemplary embodiment, in power supply circuit 801 according to the fourth exemplary embodiment shown in FIG. 11, the positions of high pass filter 804 and current detector 805 may be substituted for each other.

As with power supply circuit 701 according to the third exemplary embodiment, in power supply circuit 801 according to the fourth exemplary embodiment, power supply circuit 801 may include a low pass filter located between current detector 805 and composite signal generation circuit 806.

As with the second exemplary embodiment, composite signal generation circuit 806 shown in FIG. 11 may be composite signal generation circuit 301, 401, or 501 respectively shown in FIG. 6 to FIG. 8.

Sixth Exemplary Embodiment

Figure 13:
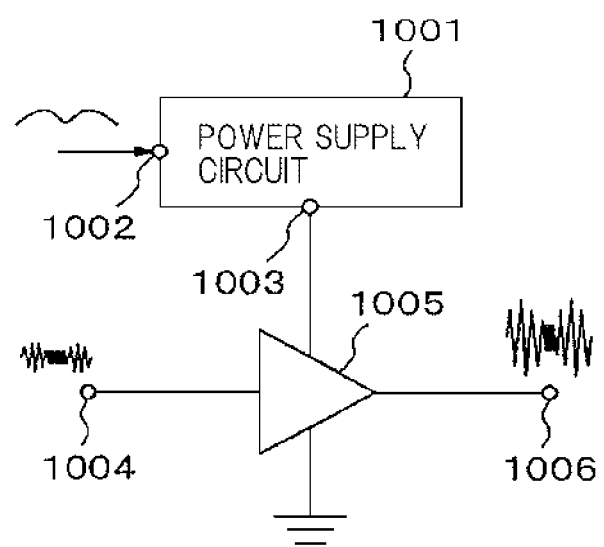
FIG. 13 is a block diagram showing an example of the structure of a radio frequency power amplifier according to a sixth exemplary embodiment of the present invention.

FIG. 13 is a block diagram showing an example of the structure of a radio frequency power amplifier according to a sixth exemplary embodiment of the present invention.

As shown in FIG. 13, the radio frequency power amplifier according to the sixth exemplary embodiment includes power supply circuit 1001, signal input terminal 1002, signal output terminal 1003, radio frequency modulation signal input terminal 1004, radio frequency power amplifier 1005, and radio frequency modulation signal output terminal 1006.

A radio frequency modulation signal that has been modulated with respect to amplitude and phase is input to radio frequency modulation signal input terminal 1004.

Input to power supply circuit 1001 is an amplitude signal that is an amplitude component of the radio frequency modulation signal that is input to radio frequency modulation signal input terminal 1004 through signal input terminal 1002.

The amplitude signal that is input to signal input terminal 1002 is amplified by power supply circuit 1001 and then is supplied as a power source to radio frequency power amplifier 1005 through signal output terminal 1003.

Radio frequency power amplifier 1005 amplifies the radio frequency modulation signal that is input to radio frequency modulation signal input terminal 1004 and then outputs the resultant signal from radio frequency modulation signal output terminal 1006.

Power supply circuit 1001 shown in FIG. 13 may be power supply circuit 10, 101, 601, 701, or 801 respectively according to the first to fifth exemplary embodiments.

Since the radio frequency power amplifier according to this exemplary embodiment includes power supply circuit 10, 101, 601, 701, or 801 that has a wide frequency bandwidth and excellent power efficiency, the radio frequency power amplifier can highly efficiently amplify a wide band of radio frequency modulation signals.

Instead of a radio frequency modulation signal that has been modulated with respect to amplitude and phase, a radio frequency modulation signal that has not been modulated with respect to amplitude (amplitude does not vary) may be input to radio frequency modulation signal input terminal 1004 shown in FIG. 13. In this case, an amplitude signal that is input to signal input terminal 1002 and then that is amplified is supplied as a power supply voltage from power supply circuit 1001 to radio frequency power amplifier 1005. Thus, radio frequency power amplifier 1005 always operates in the saturation state corresponding to the power supply voltage. In other words, radio frequency modulation signal output terminal 1006 outputs a radio frequency modulation signal that has been amplified and modulated with an amplitude signal.

In addition, the signal that is input to radio frequency modulation signal input terminal 1004 may be delayed against the amplitude signal that is input to signal input terminal 1002 so as to correct the delay of the signal that is input to radio frequency modulation signal input terminal 1004 and that is delayed by power supply circuit 1001.

With reference to the exemplary embodiments, the present invention has been described. However, it should be understood by those skilled in the art that the structure and details of the present invention may be changed in various ways without departing from the scope of the present invention.

The present application claims priority based on Japanese Patent Application JP 2011-095312 filed on Apr. 21, 2011, the entire content of which being incorporated herein by reference in its entirety.

(Supplementary 1)

A power supply circuit according to another exemplary embodiment of the present invention is a power supply circuit, comprising:

a first power amplifier that amplifies an input signal;

a first high pass filter that removes frequency components that are lower than a predetermined first cutoff frequency from an output signal of said first power amplifier;

a current detector that detects a current value of the output signal of said first power amplifier;

a composite signal generation circuit that combines said input signal and an output signal of said current detector;

a second power amplifier that amplifies an output signal of said composite signal generation circuit; and a first low pass filter that removes frequency components that are higher than a predetermined second cutoff frequency from an output signal of said second power amplifier, wherein a current of an output signal of said first high pass filter and a current of an output signal of said first low pass filter are combined and the resultant signal is output, wherein, in a frequency region in which the pass band of said first high pass filter overlaps with the pass band of said first low pass filter, a gain of a first amplification path including said first power amplifier, said first high pass filter and said current detector, matches a gain of a second amplification path including said composite signal generation circuit, said second power amplifier and said first low pass filter, and wherein a cutoff frequency of said first high pass filter is lower than a cutoff frequency of said first low pass filter.

(Supplementary 2)

The power supply circuit as set forth in supplementary 1, wherein said current detector is connected to an output of said first high pass filter, and wherein said current detector detects the current value of the output signal of said first power amplifier through said first high pass filter.

(Supplementary 3)

The power supply circuit as set forth in supplementary 1, wherein said current detector is located between said first current amplifier and said first high pass filter, and wherein said current detector directly detects the current value of the output signal of said first power amplifier.

(Supplementary 4)

The power supply circuit as set forth in supplementary 2 or 3, wherein said composite signal generation circuit includes:

an analog to digital conversion circuit that converts said input signal into a digital signal;

an amplifier that amplifies an output signal of said analog to digital conversion circuit such that the output signal has a predetermined gain;

a level shift circuit that converts an output signal of said amplifier into a signal with a center value of a predetermined reference voltage;

an adder that adds an output signal of said level shift circuit and the output signal of said current detector; and a comparator that compares an output signal of said adder with said reference voltage, if the output signal of said adder is greater than said reference voltage, said comparator outputs High, and if the output signal of said adder is lower than the output signal of said adder, said comparator outputs Low, and wherein an output signal of said comparator is input to said second power amplifier.

(Supplementary 5)

The power supply circuit as set forth in supplementary 2 or 3, wherein said composite signal generation circuit includes:

an analog to digital conversion circuit that converts said input signal into a digital signal;

a level shift circuit that converts an output signal of said analog to digital conversion circuit into a signal with a center value of a predetermined reference voltage;

an amplifier that amplifies an output signal of said current detector such that the output signal has a predetermined gain;

an adder that adds an output signal of said level shift circuit and an output signal of said amplifier; and a comparator that compares an output signal of said adder with said reference voltage, if the output signal of said adder is greater than said reference voltage, said comparator outputs High, and if the output signal of said adder is lower than the output signal of said adder, said comparator outputs Low, wherein an output signal of said comparator is input to said second power amplifier.

(Supplementary 6)

The power supply circuit as set forth in supplementary 4 or 5, wherein said comparator is a hysteresis comparator that has predetermined hysteresis width Vhys1, wherein the output signal of said adder is input to said comparator, and wherein if the immediately preceding state of said comparator is High and said input signal has a voltage that is equal to or lower than $-(Vhys1/2)$ in comparison with the reference voltage, said comparator outputs Low, and wherein if the immediately preceding state of said comparator is Low and said input signal has a voltage that is equal to or greater than (Vhys1/2) in comparison with the reference voltage, said comparator outputs High.

(Supplementary 7)

The power supply circuit as set forth in any one of supplementaries 4 to 6, wherein said analog to digital conversion circuit outputs a one-bit pulse pattern.

(Supplementary 8)

The power supply circuit as set forth in supplementary 2 or 3, wherein said composite signal generation circuit includes:

an amplifier that amplifies an output signal of said current detector such that the output signal has a predetermined gain;

an adder that adds said input signal and an output signal of said amplifier; and an analog to digital conversion circuit that converts an output signal of said adder into a one-bit pulse pattern, and wherein an output signal of said analog to digital conversion circuit is output to said second power amplifier.

(Supplementary 9)

The power supply circuit as set forth in any one of supplementaries 2 to 8, further comprising:

a second low pass filter located between said current detector and said composite signal generation circuit, wherein said second low pass filter removes frequency components that are higher than a predetermined cutoff frequency from the output signal of said current detector and then outputs the resultant signal to said composite signal generation circuit.

(Supplementary 10)

The power supply circuit as set forth in any one of supplementaries 2 to 9, further comprising:

a signal pre-processing circuit located immediately upstream of said first power amplifier and said composite signal generation circuit, wherein said signal pre-processing circuit performs a predetermined signal process for said input signal and distributes the resultant signal to said first power amplifier and said composite signal generation circuit.

(Supplementary 11)

The power supply circuit as set forth in supplementary 10, wherein said signal pre-processing circuit includes:

a delay adjustment unit that divides said input signal into two signals, assigns predetermined delay times to the signals, and then outputs the resultant signals, wherein said delay adjustment unit outputs one of the two output signals that have been assigned the delay times to said first power amplifier and the other signal to said composite signal generation circuit.

(Supplementary 12)

The power supply circuit as set forth in supplementary 11, wherein said signal pre-processing circuit includes:

a second high pass filter located between said delay adjustment unit and said first power amplifier, wherein said second high pass filter removes frequency components that are lower than a predetermined cutoff frequency from the output signals of said signal pre-processing circuit and then outputs the resultant signal to said first power amplifier.

(Supplementary 13)

The power supply circuit as set forth in supplementary 11, wherein said signal pre-processing circuit includes:

a level shift circuit located between said delay adjustment unit and said first power amplifier, wherein said level shift circuit shifts the output signal of said delay adjustment unit by a predetermined value and then outputs the resultant signal to said first power amplifier.

(Supplementary 14)

The power supply circuit as set forth in any one of supplementaries 11 to 13, wherein said signal pre-processing circuit includes:

a third low pass filter located between said delay adjustment unit and said composite signal generation circuit, wherein said third low pass filter removes frequency components that are higher than a predetermined cutoff frequency from the output signal of said signal pre-processing circuit and then outputs the resultant signal to said composite signal generation circuit.

(Supplementary 15)

The power supply circuit as set forth in any one of supplementaries 11 to 14, wherein said delay adjustment unit divides the input signal into two signals and assigns predetermined delay times to the signals such that a delay time for a first amplification path composed of said signal pre-processing circuit, said first power amplifier, said first high pass filter and said current detector, matches a delay time for a second amplification path composed of said signal pre-processing circuit, said composite signal generation circuit, said second power amplifier and said first low pass filter.

(Supplementary 16)

A radio frequency power amplifier, comprising:

a power amplifier that amplifies a radio frequency modulation signal used for information communication, and a power supply circuit as set forth in any one of supplementaries 2 to 15, an amplitude component of said radio frequency modulation signal being an input signal of said power supply circuit, wherein an output signal of said power supply circuit is supplied as a power source to said power amplifier.

The invention claimed is:

1. A power supply circuit, comprising:
a first power amplifier that amplifies an input signal;
a first high pass filter that removes frequency components that are lower than a predetermined first cutoff frequency from an output signal of said first power amplifier;
a current detector that detects a current value of the output signal of said first power amplifier;
a composite signal generation circuit that combines said input signal and an output signal of said current detector;
a second power amplifier that amplifies an output signal of said composite signal generation circuit; and
a first low pass filter that removes frequency components that are higher than a predetermined second cutoff frequency from an output signal of said second power amplifier,
wherein the first cutoff frequency of said first high pass filter is lower than the second cutoff frequency of said first low pass filter,
wherein, in a frequency region in which the pass band of said first high pass filter overlaps with the pass band of said first low pass filter, a gain of a first amplification path including said first power amplifier, said first high pass filter and said current detector, matches a gain of a second amplification path including said composite signal generation circuit, said second power amplifier and said first low pass filter, and wherein a current of an output signal of said first high pass filter and a current of an output signal of said first low pass filter are combined and the resultant signal is output.

2. The power supply circuit according to claim 1,
wherein said current detector is connected to an output of said first high pass filter, and
wherein said current detector detects the current value of the output signal of said first power amplifier through said first high pass filter.

3. The power supply circuit according to claim 1,
wherein said current detector is located between said first current amplifier and said first high pass filter, and
wherein said current detector directly detects the current value of the output signal of said first power amplifier.

4. The power supply circuit according to claim 1,
wherein said composite signal generation circuit includes:
an analog to digital conversion circuit that converts said input signal into a digital signal;
an amplifier that amplifies an output signal of said analog to digital conversion circuit such that the output signal has a predetermined gain;
a level shift circuit that converts an output signal of said amplifier into a signal with a center value of a predetermined reference voltage;
an adder that adds an output signal of said level shift circuit and the output signal of said current detector; and
a comparator that compares an output signal of said adder with said reference voltage, and if the output signal of said adder is greater than said reference voltage, said comparator outputs High, and if the output signal of said adder is lower than the output signal of said adder, said comparator outputs Low, and
wherein an output signal of said comparator is input to said second power amplifier.

5. The power supply circuit according to claim 1,
wherein said composite signal generation circuit includes:
an analog to digital conversion circuit that converts said input signal into a digital signal;
a level shift circuit that converts an output signal of said analog to digital conversion circuit into a signal with a center value of a predetermined reference voltage;
an amplifier that amplifies an output signal of said current detector such that the output signal has a predetermined gain;
an adder that adds an output signal of said level shift circuit and an output signal of said amplifier; and
a comparator that compares an output signal of said adder with said reference voltage, and if the output signal of said adder is greater than said reference voltage, said comparator outputs High, and if the output signal of said adder is lower than the output signal of said adder, said comparator outputs Low,
wherein an output signal of said comparator is input to said second power amplifier.

6. The power supply circuit according to claim 4,
wherein said comparator is a hysteresis comparator that has predetermined hysteresis width Vhys1,
wherein the output signal of said adder is input to said comparator, and
wherein if the immediately preceding state of said comparator is High and said input signal has a voltage that is equal to or lower than −(Vhys1/2) in comparison with the reference voltage, said comparator outputs Low, and
wherein if the immediately preceding state of said comparator is Low and said input signal has a voltage that is equal to or greater than (Vhys1/2) in comparison with the reference voltage, said comparator outputs High.

7. The power supply circuit according to claim 5,
wherein said comparator is a hysteresis comparator that has predetermined hysteresis width Vhys1,
wherein the output signal of said adder is input to said comparator, and
wherein if the immediately preceding state of said comparator is High and said input signal has a voltage that is equal to or lower than −(Vhys1/2) in comparison with the reference voltage, said comparator outputs Low, and
wherein if the immediately preceding state of said comparator is Low and said input signal has a voltage that is equal to or greater than (Vhys1/2) in comparison with the reference voltage, said comparator outputs High.

8. The power supply circuit according to claim 4,
wherein said analog to digital conversion circuit outputs a one-bit pulse pattern.

9. The power supply circuit according to claim 5,
wherein said analog to digital conversion circuit outputs a one-bit pulse pattern.

10. The power supply circuit according to claim 1,
wherein said composite signal generation circuit includes:
an amplifier that amplifies an output signal of said current detector such that the output signal has a predetermined gain;
an adder that adds said input signal and an output signal of said amplifier; and
an analog to digital conversion circuit that converts an output signal of said adder into a one-bit pulse pattern, and
wherein an output signal of said analog to digital conversion circuit is output to said second power amplifier.

11. The power supply circuit according to claim 1, further comprising:
a second low pass filter located between said current detector and said composite signal generation circuit,
wherein said second low pass filter removes frequency components that are higher than a predetermined cutoff frequency from the output signal of said current detector and then outputs the resultant signal to said composite signal generation circuit.

12. The power supply circuit according to claim 1, further comprising:
a signal pre-processing circuit located immediately upstream of said first power amplifier and said composite signal generation circuit,
wherein said signal pre-processing circuit performs a predetermined signal process for said input signal and distributes the resultant signal to said first power amplifier and said composite signal generation circuit.

13. The power supply circuit according to claim 12,
wherein said signal pre-processing circuit includes:
a delay adjustment unit that divides said input signal into two signals, assigns predetermined delay times to the signals, and then outputs the resultant signals,
wherein said delay adjustment unit outputs one of the two output signals that have been assigned the delay times to said first power amplifier and the other signal to said composite signal generation circuit.

14. The power supply circuit according to claim 13,
wherein said signal pre-processing circuit includes:
a second high pass filter located between said delay adjustment unit and said first power amplifier,
wherein said second high pass filter removes frequency components that are lower than a predetermined cutoff frequency from the output signals of said signal pre-processing circuit and then outputs the resultant signal to said first power amplifier.

15. The power supply circuit according to claim 13, wherein said signal pre-processing circuit includes:
a level shift circuit located between said delay adjustment unit and said first power amplifier,
wherein said level shift circuit shifts the output signal of said delay adjustment unit by a predetermined value and then outputs the resultant signal to said first power amplifier.

16. The power supply circuit according to claim 13, wherein said signal pre-processing circuit includes:
a third low pass filter located between said delay adjustment unit and said composite signal generation circuit,
wherein said third low pass filter removes frequency components that are higher than a predetermined cutoff frequency from the output signal of said signal pre-processing circuit and then outputs the resultant signal to said composite signal generation circuit.

17. The power supply circuit according to claim 13, wherein said delay adjustment unit divides the input signal into two signals and assigns predetermined delay times to the signals such that a delay time for a first amplification path composed of said signal pre-processing circuit, said first power amplifier, said first high pass filter and said current detector, matches a delay time for a second amplification path composed of said signal pre-processing circuit, said composite signal generation circuit, said second power amplifier and said first low pass filter.

18. A radio frequency power amplifier, comprising:
a power amplifier that amplifies a radio frequency modulation signal used for information communication, and
a power supply circuit according to claim 1, an amplitude component of said radio frequency modulation signal being an input signal of said power supply circuit,
wherein an output signal of said power supply circuit is supplied as a power source to said power amplifier.

* * * * *